United States Patent [19]

Poss et al.

[11] Patent Number: 5,815,106
[45] Date of Patent: Sep. 29, 1998

[54] SPLIT FLASH ANALOG TO DIGITAL CONVERTER DIFFERENTIAL DRIVER

[75] Inventors: Joe Martin Poss, Rochester; Timothy Joseph Schmerbeck, Kasson, both of Minn.

[73] Assignee: International Business Machines Corporation, Armonk, N.Y.

[21] Appl. No.: 728,044

[22] Filed: Oct. 9, 1996

[51] Int. Cl.[6] .................................................. H03M 1/36
[52] U.S. Cl. .......................................... 341/159; 341/118
[58] Field of Search .................................... 341/159, 158, 341/160, 136, 118

[56] References Cited

U.S. PATENT DOCUMENTS

| | | | |
|---|---|---|---|
| 4,990,917 | 2/1991 | Kohdaka | 341/159 |
| 5,164,728 | 11/1992 | Matsuzawa et al. | 341/159 |
| 5,291,198 | 3/1994 | Kingwall et al. | 341/159 |
| 5,384,569 | 1/1995 | Komatsu | 341/159 |
| 5,589,831 | 12/1996 | Knee | 341/159 |

OTHER PUBLICATIONS

"Differential High–Speed Analog to Digital Converter", Schulte and D.P. Swart, IBM Technical Disclosure Bulletin, vol. 38, No. 1, Jan. 1995, pp. 425–427.

*Primary Examiner*—Jeffrey A. Gaffin
*Assistant Examiner*—Jason L.W. Kost
*Attorney, Agent, or Firm*—Joan Pennington

[57] ABSTRACT

A high speed differential analog to digital converter (ADC) is provided. The high speed differential ADC includes a driver section, a comparator section and a decoder section. The driver section includes a pair of series connected resistor ladders with a positive phase voltage source connected at the top and bottom of one of the pair of series connected resistor ladders and a negative phase voltage source connected at the top and bottom of the other one of the pair of series connected resistor ladders; both the positive phase voltage source and the negative phase voltage source including a predetermined first DC voltage value. At least one additional positive phase voltage source is connected to the one of the pair of series connected resistor ladders and at least one additional negative phase voltage source is connected to the other one of the pair of series connected resistor ladders. The additional positive phase and negative phase voltage sources include a predetermined second DC voltage value.

11 Claims, 5 Drawing Sheets

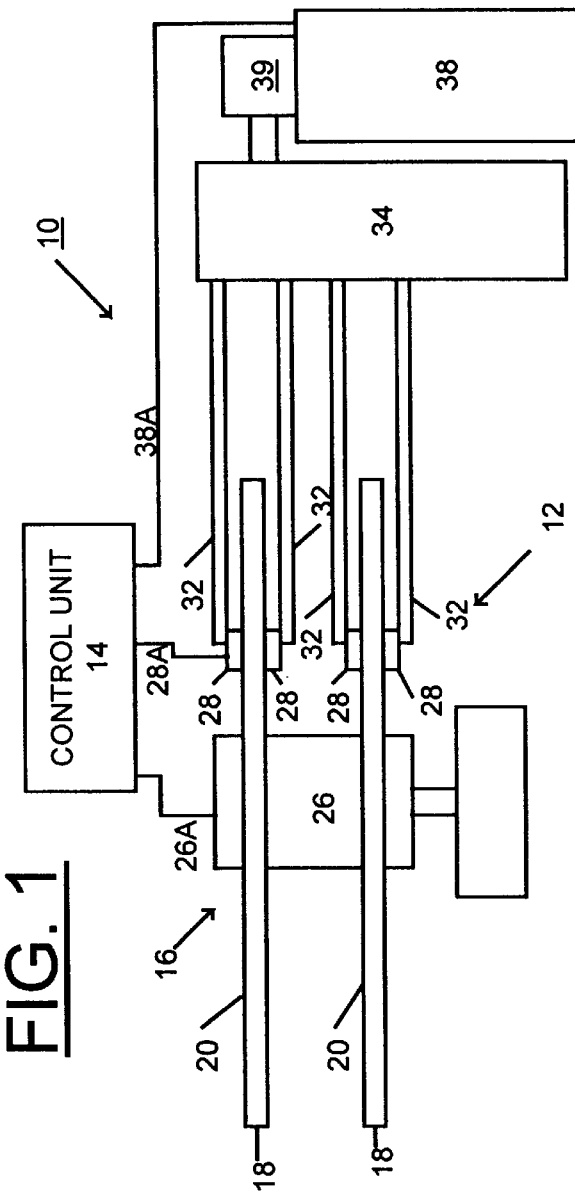
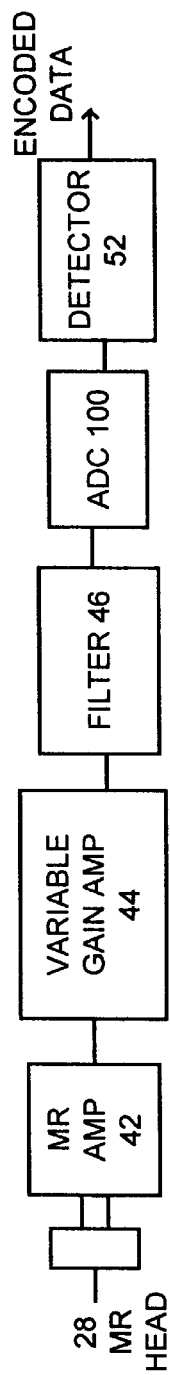
FIG. 1
FIG. 2

SPLIT FLASH ANALOG TO DIGITAL CONVERTER DIFFERENTIAL DRIVER

FIELD OF THE INVENTION

The present invention relates to differential high speed or flash analog to digital converters, and more particularly, to an improved high speed differential analog to digital converter (ADC).

DESCRIPTION OF THE PRIOR ART

Many flash ADCs use the negative input of a comparator as a static reference voltage. In a differential analog to digital converter (ADC), a differential voltage input is applied to the comparator.

FIG. 3 illustrates a conventional high speed differential analog to digital converter (ADC) in simplified form. The differential ADC has three sections including a driver section, a comparator section and a decode section. The driver section includes two resistor ladders. Each resistor ladder includes $2^{(N-1)}$ resistors or 32 for the illustrated 6-bit differential flash ADC, where N=6. The comparator section includes a series string of $(2^N)-1$ comparators C1 through C63. The driver section includes four voltage sources to differentially drive both ends of the two resistor ladders. VPAC represents the positive phase of the input signal and VNAC represents the negative phase of the input signal. One side of the ladder (R1 through R32) receives an input signal of an opposite phase of the other side of the ladder (R33 through R64). The voltage source connected to R32 and R64 have a DC voltage as well, represented by VPAC-VDC and VNAC-VDC. This sets the full voltage drop across both resistor ladders and determines the full range of the ADC. The series resistors divide down the full scale input reference voltage into least significant bits (LSBs). Each resistor has a one least significant bit (LSB) DC voltage drop. The differential input signal at the center taps between resistors is DC coupled into the comparator non-inverting and inverting inputs or ports IN+ and IN− of the comparators C1–C63.

The speed of the driver section is limited by the worse case time constant delay of the resistor ladder string. Each resistor and comparator input has associated with it some parasitic capacitance that is generally evenly distributed along the resistor ladder string. The resistors that are closest to the voltage sources will have the least time constant delay and provide the maximum bandwidth. These voltage nodes are labeled VTOP and VBOT. The resistors that are labeled R16, R17, R48 and R49 represent the voltage nodes that have the greatest time constant because they are the greatest resistance from each voltage source. This differential node, labeled+VMID−, as a result determines the maximum speed that can be achieved by the entire ADC driver.

One solution to speed up the ADC driver is to minimize the resistance and capacitance at each node of the ADC ladder. Parasitic capacitance, especially in integrated circuits, is limited to the process and layout of the circuit. Dropping the resistance requires more current to maintain the same ADC voltage range. Doubling the speed of this driver configuration for a given chip process requires a two times increase in power, since the capacitance will not change, the resistance must be decreased by a factor of two for each R*C time delay.

A need exists to provide a faster implementation of a differential flash analog to digital converter (ADC) without increasing the power proportionally.

SUMMARY OF THE INVENTION

A principal object of the present invention is to provide an improved high speed differential analog to digital converter (ADC). Other objects are to provide such high speed differential ADC for data detection in a direct access storage device; to provide such high speed differential ADC substantially without negative effects and that overcome many of the disadvantages of prior art arrangements.

In brief, a high speed differential analog to digital converter (ADC) is provided. The high speed differential ADC includes a driver section, a comparator section and a decoder section. The driver section includes a pair of series connected resistor ladders with a positive phase voltage source connected at the top and bottom of one of the pair of series connected resistor ladders and a negative phase voltage source connected at the top and bottom of the other one of the pair of series connected resistor ladders; both the positive phase voltage source and the negative phase voltage source including a predetermined first DC voltage value. At least one additional positive phase voltage source is connected to the one of the pair of series connected resistor ladders and at least one additional negative phase voltage source is connected to the other one of the pair of series connected resistor ladders. The additional positive phase and negative phase voltage sources include a predetermined second DC voltage value.

BRIEF DESCRIPTION OF THE DRAWINGS

The present invention together with the above and other objects and advantages may best be understood from the following detailed description of the preferred embodiments of the invention illustrated in the drawings, wherein:

FIG. 1 is a schematic and block diagram of a data storage disk file embodying the present invention;

FIG. 2 is a block diagram illustrating a data channel of the data storage disk file of FIG. 1 including a high speed differential analog to digital converter of the present invention;

DETAILED DESCRIPTION OF THE PREFERRED EMBODIMENTS

Figure 3:
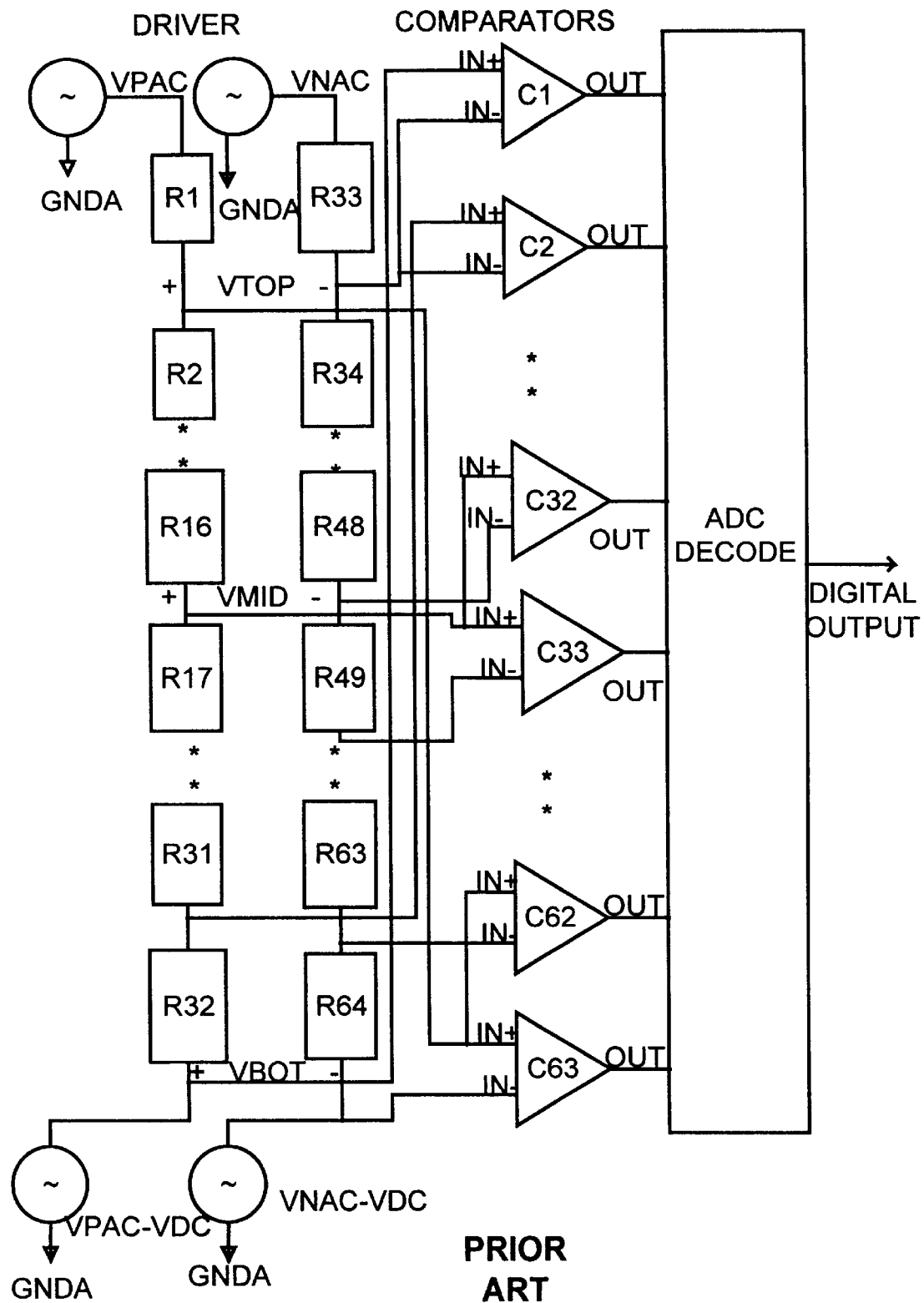
FIG. 3 is schematic diagram illustrating a conventional high speed differential analog to digital converter.

Having reference now to the drawings, in FIG. 1 there is illustrated a data storage disk file generally designated as 10 including a rigid magnetic disk drive unit 12 and an interface control unit generally designated as 14. Unit 12 is illustrated in simplified and diagrammatic form sufficient for an understanding of the present invention. The utility of the present invention is not restricted to the details of a particular drive unit construction.

The disk drive unit 12 includes a stack 16 of disks 18 each having at least one magnetic surface 20. The disks 18 are mounted parallel to one another for simultaneous rotation on and by an integrated spindle and motor assembly 26. Information on each magnetic disk surface 20 is read from or written to the disk surface 20 by a corresponding transducer head assembly 28 movable in a path having a radial component across the rotating disk surface 20.

Each transducer head 28 is mounted on a flexure spring (not shown) carried by an arm 32. The arms 32 are ganged together for simultaneous pivotal movement about a support spindle 34. One arm 32 includes an extension 36 driven in pivotal movement by a head drive servo motor 38 including a voice coil 39 cooperating with an internal magnet and core assembly. Drive signals applied to the voice coil 39 cause the arms 32 to move in unison to position the transducer heads 28 in registration with information storage tracks on the disk surfaces 20 where information is written or read.

The disk drive unit 12 is controlled in operation by signals provided by the control unit 14, including motor control signals on line 26A and head position control signals on line 38A. In a typical arrangement, control unit 14 provides an interface with a computer that provides data read and write commands, and data signals are transmitted to or from the transducer heads over corresponding lines 28A, one of which is seen in FIG. 1. Servo position information is recorded on the disk surfaces 20, and the transducer heads 28 read this servo information to provide a servo position signal to the control unit 14. This information is employed by the control unit 14 to provide position control signals on line 38A. The purpose of this position feedback system is to assure accurate and continuous positioning of the transducer heads 28 so that data is written to and read from precise locations on the disk surfaces 20.

In FIG. 2, there is shown an exemplary data channel generally designated as 40 disk drive unit 12 including a high speed differential analog to digital converter (ADC) 100 of the present invention. The read signal from a MR transducer head 28 is amplified by an MR amplifier 42 and applied to a variable gain amplifier 44. The amplified read signal is applied to a filter 46. The filtered read signal is converted to digital form by the ADC 100. A detector 52 is coupled to the ADC 100 receiving digital sample values and providing encoded data.

Figure 4:
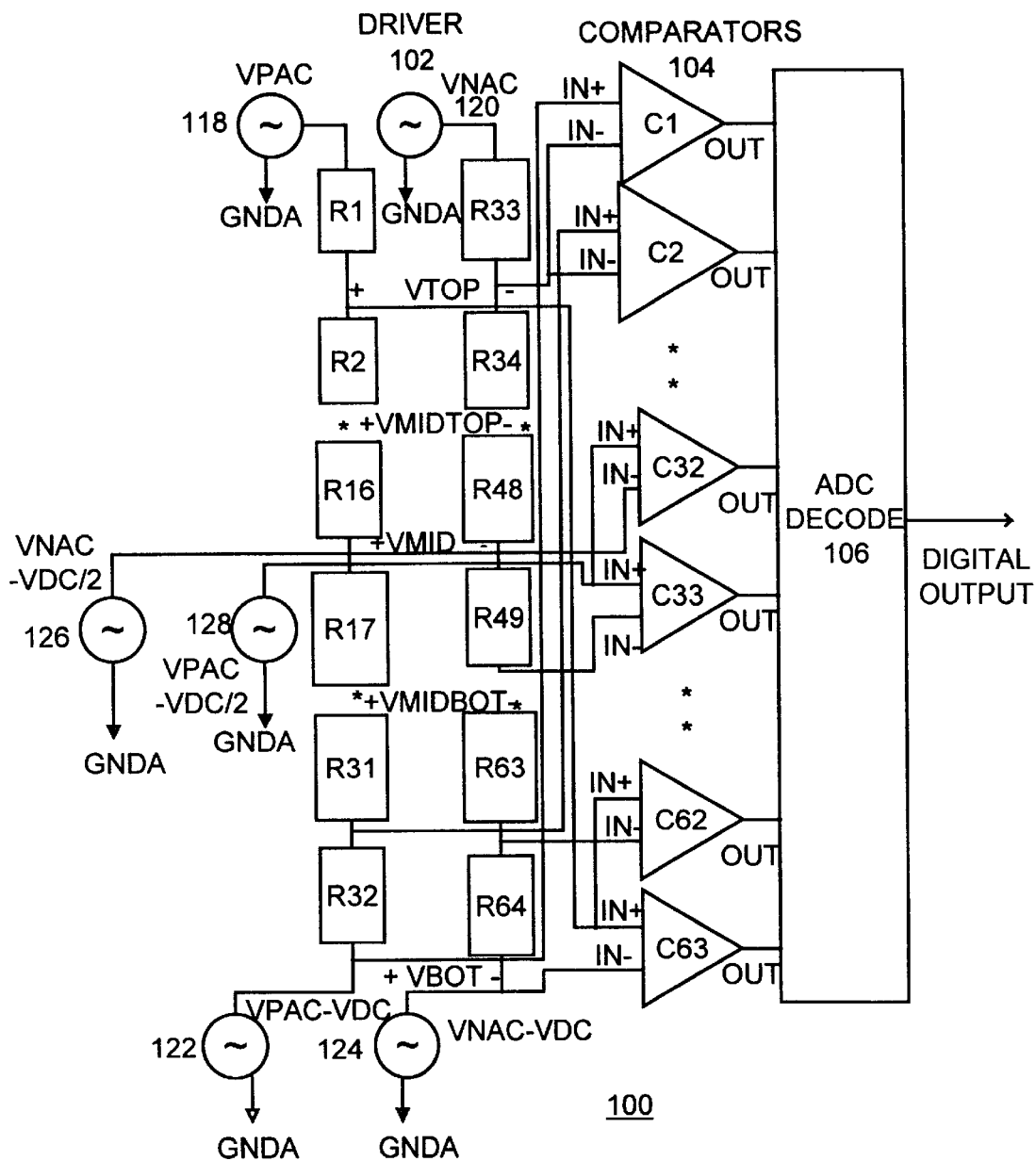
FIG. 4 is schematic diagram representation of a high speed differential analog to digital converter in accordance with the invention.

In FIG. 4 there is shown an exemplary high speed differential analog to digital converter in accordance with the invention generally designated by the reference character 100. The differential ADC has three sections including a driver section 102, a comparator section 104 and a decode section 106. The driver section 102 includes two resistor ladders R1–R32 and R33–R64. Each resistor ladder includes $2^{(N-1)}$ resistors or 32 for the illustrated 6-bit differential flash ADC, where N=6.

In accordance with a feature of the invention, the ADC driver section 102 includes six voltage sources 118, 120, 122, 124, 126, and 128. Improved speed performance of the ADC driver section 102 is achieved by the split ladder configuration where the middle of the ladders labeled VMID + and − at the junction of R16 and R17 and R48 and R49 is driven with the voltage source 126, 128, respectively. Voltage sources 126, 128 are in phase and include ½ the DC voltage drop of voltage sources 118, 120, respectively. As compared to the conventional arrangement of FIG. 3 where VMID is the worse case bandwidth point, VMID of ADC driver section 102 provides the fastest bandwidth point, the same as VTOP and VBOT.

In the ADC driver section 102, the worse case bandwidth points are equally between VTOP and VMID and VMID and VBOT, at nodes labeled as VMIDTOP + and − and VMIDBOT + and −. As compared to worse case bandwidth point VMID of FIG. 3 with the same resistance and capacitance at each node, VMIDTOP and VMIDBOT have four times less R*C delay to the voltage source 118, 120, 122, 124, 126, and 128. As a result, the ADC driver section 102 is four times faster substantially without a power increase. With the two voltage sources 126 and 128 added, the total AC current required for six voltage sources 118, 120, 122, 124, 126, and 128 is approximately equal to the total AC current required for four voltage sources in the conventional or non-split arrangement of FIG. 3.

Figure 5:
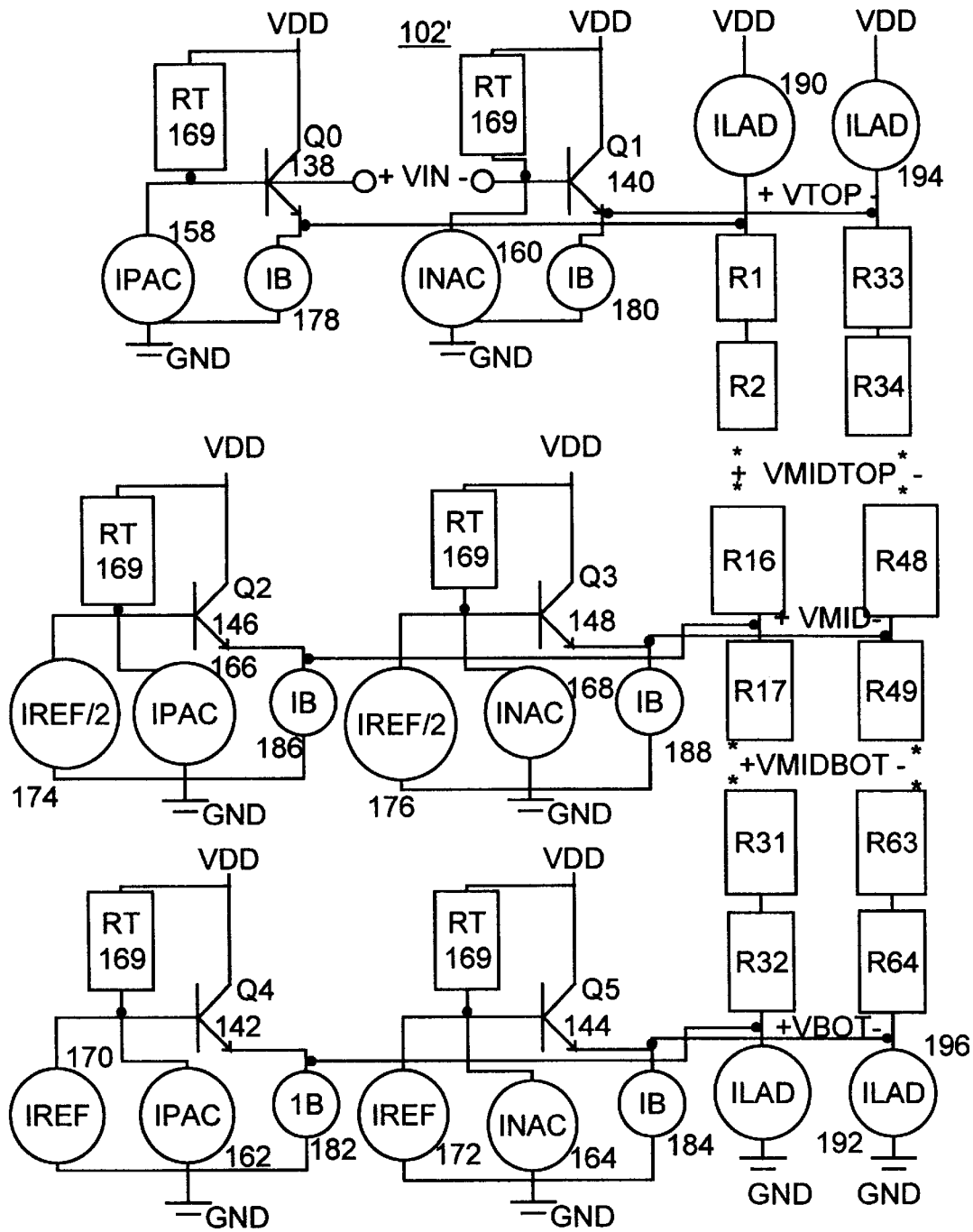
FIG. 5 is a schematic diagram representation of an exemplary high speed differential analog to digital converter driver circuitry in accordance with the invention.

FIG. 5 shows an exemplary, practical implementation of a split ADC driver section of the invention generally designated by the reference character 102'. In a split ADC driver section 102', the voltage sources 118, 120, 122, 124, 126, and 128 of the split ADC driver section 102 of FIG. 4 are replaced by emitter follower transistors Q0–Q5 138, 140, 142, 144, 146, and 148, each driven by a respective AC current source IPAC, INAC 158, 160, 162, 164, 166, and 168. A biasing resistor RT 169 is connected between the supply VDD and the base of each emitter follower transistor Q0–Q5 138, 140, 142, 144, 146, and 148. DC current sources IREF and IREF/2 170, 172, 174 and 176 are provided to set the full scale range of ADC. DC current sources IB 178, 180, 182, 184, 186, and 188 are provided to bias the emitter follower transistors Q0–Q5 138, 140, 142, 144, 146, and 148. DC current sources ILAD 190, 192, 194, 196 are provided to supply current to the resistor ladders R1–R32, R33–R64 without requiring current from the emitter follower transistors Q0–Q5 138, 140, 142, 144, 146, and 148.

Figure 6:
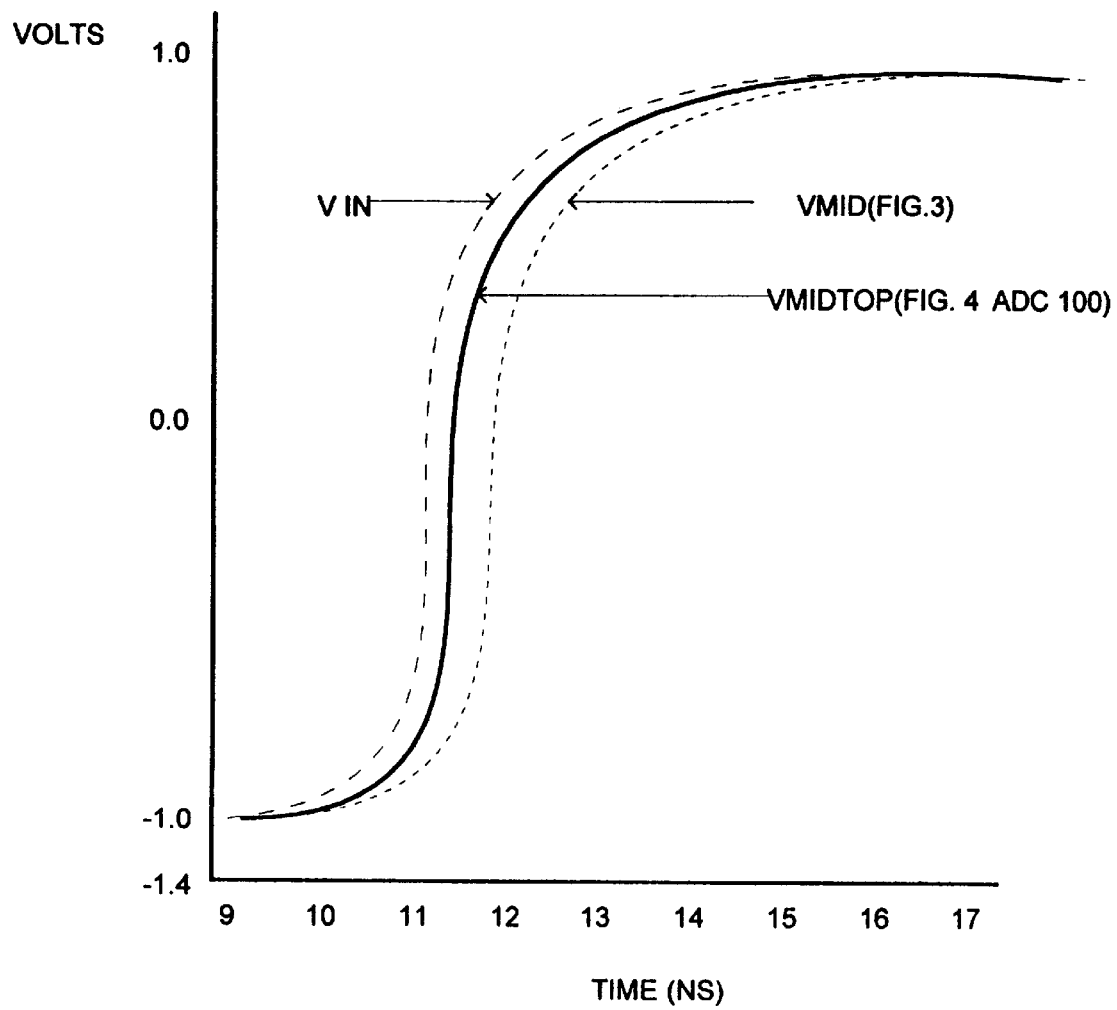
FIG. 6 is a graph illustrating differential voltage step response of the high speed differential analog to digital converter of FIG. 4 of the present invention with respect to the conventional high speed differential analog to digital converter of FIG. 3.

FIG. 6 shows simulation results for the differential voltage step response of the ADC driver 102' of FIG. 4 of the present invention with respect to the conventional high speed differential analog to digital converter of FIG. 3. The conventional ADC design of FIG. 3 does not include Q2 and Q3 voltage drivers 146 and 148. A differential current step of 1 ns produced a differential voltage step labeled as Vin in FIG. 6. In FIG. 6, a voltage response at VMIDTOP of ADC driver 102' is compared with VMID of FIG. 3 from the conventional ADC. For the same amount of parasitic capacitance the response time from VMIDTOP of ADC driver 102' is nearly 1 ns faster than VMID from the conventional ADC of FIG. 3. IB for the conventional ADC design of FIG. 3 equals 2 mA and IB for the ADC driver 102' equals 1.5 mA. For both designs ILAD=1.56 mA, IREF=0.2 mA, IPAC=INAC= 200 μA peak-to-peak, RT=5K ohms, R1 through R64=20 ohms, and each node of the resistor ladder has 0.1 pF of capacitance to ground (not shown).

This represents a significant performance advantage which allows the differential voltage at the ADC comparators C1–C63 to settle quicker which translates to a shorter sampling period of the Flash ADC 100. A total current increase of only 1.4 mA results for the split ADC driver 102' verses the conventional ADC of FIG. 3. In order to achieve the same bandwidth for the conventional ADC of FIG. 3, the ladder resistors R1–R64 must be reduced to 4 ohms and the ILAD current would increase to 8 mA for a total increase of 16 mA–4 mA 12 mA. For a 5V design the power savings from the split ADC driver 102' verses the conventional ADC of FIG. 3 for the same bandwidth is 5V (12 mA–1.4 mA)=53 mW. This power savings can represent a significant portion of total power used in the entire flash ADC 100.

It should be understood that the present invention is not limited to the illustrated arrangements 102, 102'. For example, more points on each ladder could be driven with additional emitter followers. A disadvantage of too many emitter followers is maintaining matching between each IPAC and INAC, and maintaining matching between each IREF. Depending on the LSB size of the ADC 100, trimming currents to within ¼ LSB to ½ LSB may be necessary to maintain ADC accuracy. Driving three or four points on each ladder is adequate since the bandwidth would most likely limited by the voltage sources or the comparators.

While the present invention has been described with reference to the details of the embodiments of the invention shown in the drawing, these details are not intended to limit the scope of the invention as claimed in the appended claims.

What is claimed is:

1. A high speed differential analog to digital converter (ADC) comprising:
    a driver section including a pair of series connected resistor ladders; a pair of positive phase voltage sources connected at the top and bottom of one of said pair of series connected resistor ladders; a pair of negative phase voltage sources connected at the top and bottom of the other one of said pair of series connected resistor ladders; both said positive phase voltage source and said negative phase voltage source including a predetermined first DC voltage value;
    a comparator section including a series string of comparators; a differential input signal at respective center taps between series connected resistors of said pair of series connected resistor ladders coupled into an inverting input and a non-inverting input of respective comparators; and
    a decode section; outputs of said series string of comparators coupled to said decode section for providing a digital output;
    said high speed differential analog to digital converter (ADC) being characterized by:
        an additional positive phase voltage source connected to a middle of said one of said pair of series connected resistor ladders, said additional positive phase voltage source being in phase with said pair of positive phase voltage sources, and an additional negative phase voltage source connected to a middle of said other one of said pair of series connected resistor ladders, said additional negative phase voltage source being in phase with said pair of negative phase voltage sources; both said one additional positive phase voltage source and said additional negative phase voltage source having a predetermined second DC voltage value; said predetermined second DC voltage value equals one half of said predetermined first DC voltage value.

2. A high speed differential analog to digital converter (ADC) as recited in claim 1 wherein said positive phase and negative phase voltage sources comprise an emitter follower transistor driven by an AC current source.

3. A high speed differential analog to digital converter (ADC) as recited in claim 2 includes a DC current source for biasing said emitter follower transistor.

4. A high speed differential analog to digital converter (ADC) as recited in claim 2 includes a DC current source coupled to predetermined ones of said emitter follower transistors for providing said predetermined first DC voltage value and said predetermined second DC voltage value.

5. A high speed differential analog to digital converter (ADC) as recited in claim 1 wherein said positive phase and negative phase voltage sources comprise an emitter follower transistor driven by an AC current source and wherein said predetermined first DC voltage value is provided by a first DC current source IREF and said predetermined second DC voltage value is provided by a second DC current source IREF/2.

6. A driver section for a high speed differential analog to digital converter (ADC) comprising:
    a pair of series connected resistor ladders;
    a pair of positive phase voltage sources connected at the top and bottom of one of said pair of series connected resistor ladders; a pair of negative phase voltage sources connected at the top and bottom of the other one of said pair of series connected resistor ladders; both said positive phase voltage source and said negative phase voltage source including a predetermined first DC voltage value; and
    an additional positive phase voltage source connected to a middle of said one of said pair of series connected resistor ladders, said additional positive phase voltage source being in phase with said pair of positive phase voltage sources, and an additional negative phase voltage source connected to a middle of said other one of said pair of series connected resistor ladders, said additional negative phase voltage source being in phase with said pair of negative phase voltage sources; both said additional positive phase voltage source and said additional negative phase voltage source having a predetermined second DC voltage value; said predetermined second DC voltage value equals one half of said predetermined first DC voltage value.

7. A driver section for a high speed differential analog to digital converter (ADC) as recited in claim 6 wherein said positive phase and negative phase voltage sources comprise an emitter follower transistor driven by an AC current source.

8. A driver section for a high speed differential analog to digital converter (ADC) as recited in claim 7 includes a DC current source coupled to predetermined ones of said emitter follower transistors for providing said predetermined first DC voltage value and said predetermined second DC voltage value.

9. A direct access storage device including a data channel comprising:
    at least one disk mounted for rotation about an axis and having at least one disk surface for storing data;
    transducer means mounted for movement across said disk surface for reading and writing data to said disk surface;
    an analog to digital converter (ADC) coupled to said tansducer means for converting an analog signal to digital sample values including:
        a pair of series connected resistor ladders;
        a pair of positive phase voltage sources connected at the top and bottom of one of said pair of series connected resistor ladders; a pair of negative phase voltage sources connected at the top and bottom of the other one of said pair of series connected resistor ladders; both said positive phase voltage source and said negative phase voltage source including a predetermined first DC voltage value; and
        an additional positive phase voltage source connected to a middle of said one of said pair of series connected resistor ladders, said additional positive phase voltage source being in phase with said pair of positive phase voltage sources, and an additional negative phase voltage source connected to a middle of said other one of said pair of series connected resistor ladders, said additional negative phase voltage source being in phase with said pair of negative phase voltage sources; both said additional positive phase voltage source and said additional negative phase voltage source having a predetermined second DC voltage value; said predetermined second DC voltage value equals one half of said predetermined first DC voltage value.

10. A direct access storage device as recited in claim 9 wherein said positive phase and negative phase voltage sources comprise an emitter follower transistor driven by an AC current source.

11. A direct access storage device as recited in claim 10 includes a DC current source coupled to predetermined ones of said emitter follower transistors for providing said predetermined first DC voltage value and said predetermined second DC voltage value.

* * * * *